(12) United States Patent
McCutcheon et al.

(10) Patent No.: US 7,775,785 B2
(45) Date of Patent: Aug. 17, 2010

(54) CONTACT PLANARIZATION APPARATUS

(75) Inventors: Jeremy W. McCutcheon, Rolla, MO (US); Robert D. Brown, Rolla, MO (US)

(73) Assignee: Brewer Science Inc., Rolla, MO (US)

( * ) Notice: Subject to any disclaimer, the term of this patent is extended or adjusted under 35 U.S.C. 154(b) by 858 days.

(21) Appl. No.: 11/613,898

(22) Filed: Dec. 20, 2006

(65) Prior Publication Data

US 2008/0153405 A1  Jun. 26, 2008

(51) Int. Cl.
*B28B 1/00* (2006.01)
*B29C 35/08* (2006.01)

(52) U.S. Cl. .................. 425/405.1; 425/174.4
(58) Field of Classification Search .......... 425/174.4, 425/405.1; 100/211
See application file for complete search history.

(56) References Cited

U.S. PATENT DOCUMENTS

| | | | |
|---|---|---|---|
| 4,515,828 A | 5/1985 | Economy et al. |
| 5,434,107 A | 7/1995 | Paranjpe |
| 5,605,867 A | 2/1997 | Sato et al. |
| 5,650,261 A | 7/1997 | Winkle |
| 5,679,610 A | 10/1997 | Matsuda et al. |
| 5,736,424 A | 4/1998 | Prybyla et al. |
| 5,756,256 A | 5/1998 | Nakato et al. |
| 5,935,762 A | 8/1999 | Dai et al. |
| 5,967,030 A | 10/1999 | Blalock |
| 5,985,524 A | 11/1999 | Allen et al. |
| 6,044,851 A | 4/2000 | Grieger et al. |
| 6,048,799 A | 4/2000 | Prybyla |
| 6,062,133 A | 5/2000 | Blalock |
| 6,237,483 B1 | 5/2001 | Blalock |
| 6,331,488 B1 | 12/2001 | Doan et al. |

(Continued)

FOREIGN PATENT DOCUMENTS

EP  0 683 511 A2  11/1995

OTHER PUBLICATIONS

"Chemical Mechanical Planarization (CMP)," SC Solutions, http://www.scsolutions.com/cmp.html, 4 pages.

(Continued)

*Primary Examiner*—Maria Veronica D Ewald
(74) *Attorney, Agent, or Firm*—Hovey Williams LLP

(57) ABSTRACT

A contact planarization apparatus includes a lower membrane assembly, an upper membrane assembly, a differential pressure assembly, and a curing or reflowing assembly. The lower membrane assembly supports a substrate to be planarized and biases it toward the upper membrane assembly under the influence of the pressure differential assembly. The upper membrane assembly planarizes the coating on the substrate under the influence of the differential pressure assembly and includes a flexible sheet which is supported above the substrate stage and below the curing or reflowing assembly via a vacuum force applied by the differential pressure assembly. The differential pressure assembly moves the lower and upper membrane assemblies relative to one another to planarize the coating on the substrate entirely through the application of vacuum and pressure forces. The differential pressure assembly includes atop pressure chamber positioned above the upper face of the upper sheet, a bottom pressure chamber positioned below the lower face of the lower sheet, and a central pressure chamber positioned generally between the lower face of the upper sheet and the upper face of the lower sheet.

22 Claims, 8 Drawing Sheets

U.S. PATENT DOCUMENTS

| | | | |
|---|---|---|---|
| 6,383,890 B2 | 5/2002 | Takisawa et al. | |
| 6,391,798 B1 | 5/2002 | DeFelice et al. | |
| 6,407,006 B1 | 6/2002 | Levert et al. | |
| 6,544,466 B1 | 4/2003 | Westmoreland | |
| 6,580,172 B2 | 6/2003 | Mancini et al. | |
| 6,610,593 B2 | 8/2003 | Kohl et al. | |
| 6,677,252 B2 * | 1/2004 | Marsh | 438/780 |
| 6,716,767 B2 | 4/2004 | Shih et al. | |
| 6,743,724 B2 | 6/2004 | Doan et al. | |
| 6,797,607 B2 | 9/2004 | Endisch et al. | |
| 6,881,134 B2 * | 4/2005 | Brown | 451/285 |
| 7,082,876 B2 | 8/2006 | Olsson | |
| 2002/0093122 A1 | 7/2002 | Choi et al. | |
| 2002/0106899 A1 | 8/2002 | Blalock et al. | |
| 2004/0029041 A1 | 2/2004 | Shih et al. | |
| 2004/0040644 A1 | 3/2004 | Chang et al. | |
| 2005/0020046 A1 | 1/2005 | Brenner | |
| 2005/0056963 A1 | 3/2005 | McCutcheon | |
| 2006/0035464 A1 | 2/2006 | Sreenivasan | |

OTHER PUBLICATIONS

"Chemical Mechanical Planarization (CMP)," Tech Brief, Copyright 2003 IC Knowledge, ICKnowledge.com. 1 page.

"Introduction to Microlithography," Second Edition, edited by Larry F. Thompson, C. Grant Wilson, and Murrae J. Bowden, ACS Professional Reference Book, American Chemical Society, Washington, DC, 1994, pp. 232-239, pp. 347-348, and pp. 356-361.

"Dual-Damascene Interconnects" in Silicon Processing for the VLSI Era, vol. 4: Deep Submicron Process Technology, Stanley Wolf, Lattice Press, Sunset Beach, California, 2002, Ch. 15, pp. 671-710.

Cesar M. Garza, Jeffrey D. Byers, Lewis Flanagin, and Maurren Hanratty, "Photoresist Materials and Processing" in Handbook of Semiconductor Manufacturing Technology, edited by Yoshio Nishi and Robert Doering, Marcel Dekker, Inc., New York City, New York, 2000, p. 499, pp. 528-537.

Jan. 15, 1998 IDS filed by applicant in application that issued as U.S. Patent No. 5,967,030.

* cited by examiner

CONTACT PLANARIZATION APPARATUS

BACKGROUND OF THE INVENTION

1. Field of the Invention

The present invention relates to improved methods and apparatus for the contact planarization of surfaces such as those developed during the manufacture of advanced integrated circuits and other devices.

2. Description of the Prior Art

Advanced integrated circuit (IC) designs are highly dependent on complex device-layering techniques to produce semiconductor devices that are more powerful, have lower profiles, and require less energy to operate. To make these qualities possible, more circuits with much finer structures must be integrated into a microchip by constructing multiple layers of interconnects and dielectrics on a semiconductor substrate in an appropriate sequence. Currently, photolithography is the predominant technique used to pattern these ultra-fine structures. This technique requires materials to be deposited and removed from the surface to construct such ultra-fine structures.

Photolithography involves depositing a photosensitive material, known as a photoresist, onto a semiconductor substrate surface. An optical transparent object, known as the photomask or reticle, with pre-defined images of the structures to be built on the semiconductor surface is placed above the photoresist-coated substrate. An appropriate wavelength of light is then illuminated through the optical object. The light either decomposes or cures the exposed area of the photoresist, depending on the nature of the photoresist and the process. The semiconductor surface is then developed to produce the patterned image on the substrate surface, and the procedure is then repeated for additional layers.

Materials can be applied in a uniform thickness if the surface to be coated is entirely planar. However, if the surface is not planar, materials may not coat with a uniform thickness. For example, a coating deposited on top of a topographic surface tends to contour to the topography of the underlying surface, thus producing a non-planar surface. As more layers are built on the substrate, the severity of the surface topography increases. Unfortunately, non-planar surfaces reduce the final yield and performance of IC devices. Moreover, at some point of applying successive layers of structure to a non-uniform surface of an IC, the non-planar surface becomes unsuitable for constructing the next structural layer. Therefore, the topographic surface of the IC must be planarized, or flattened, prior to the construction of the next layer. To planiarize the topographic surface, techniques such as plasma etch-back, chemical mechanical polishing (CMP), and contact planarization can be used. The present invention relates to contact planarization techniques.

With prior art contact planarization techniques, the topographic surface is first deposited with a flowable planarization material. The surface is then pressed against a flat surface (optical flat) to cause the material to flow around the topographic structures. The material is then hardened by either photo-irradiation or heat to replicate the planarity of the flat surface onto the planarized material surface. The planarized material surface is then released from the flat surface. To facilitate the separation, the flat surface can be treated with a low friction material such as a fluoropolymer a fluorinated compound to lower its surface energy. Alternatively, a low surface energy material such as Teflon® materials, fluorocarbon polymers, or the like with comparable surface planarity, such as a disk or film, can be placed between the planarization material and flat surface.

Prior art devices suffer from several limitations. For example, the optical flat (and often other pieces of the apparatus) is interposed between the UV radiation or heat source and the substrate, and thus create a substantial thermal or UV absorbing mass which must be overcome to cure the underlying substrate. This substantially increases the cure time of the coating applied to the substrate, and thus reduces the throughput of the apparatus.

Another disadvantage of prior art contact planarization devices is that much of the planarization is achieved by sandwiching the substrate and its planarizable coating between a rigid substrate support assembly and a rigid optical flat assembly or other backing. Sandwiching the substrate between rigid structures to effect much of the planarization makes it difficult to precisely control the pressure applied to the substrate and its coating and the targeting of the pressure. Many prior art contact planarization devices also do not sufficiently evacuate air from the area around the substrate during planarization, causing unwanted air bubbles to be entrapped in the coating.

Accordingly, there is a need for an improved contact planarization apparatus and method that overcomes the limitations of the prior art.

SUMMARY OF THE INVENTION

The present invention solves the above-described problems and provides a distinct advance in the art of contact planarization devices and methods.

One embodiment of the present invention is a planarization apparatus broadly including a lower membrane assembly, an upper membrane assembly, a differential pressure assembly, and a curing or reflowing assembly. The apparatus is designed to efficiently contact planarize coatings applied to individual substrates, such as microelectronic, optoelectronics, photonic, optical, flat panel display, microelectromechanical systems (MEMS), biochips and sensor devices.

The lower membrane assembly is provided for supporting a substrate to be planarized and for biasing it toward the upper membrane assembly under the influence of the pressure differential assembly. The preferred lower membrane assembly includes a flexible sheet supported between a pair of clamps, a substrate stage positioned atop the flexible sheet for supporting the substrate thereon, and a stabilization stage positioned under the flexible sheet for leveling the substrate stage and for compensating for the weight of the substrate and substrate stage.

The upper membrane assembly is provided for planarizing the coating on the substrate under the influence of the differential pressure assembly and includes a flexible sheet which is supported above the substrate stage and below the curing or reflowing assembly via a vacuum force applied by the differential pressure assembly. The flexible sheet is preferably formed from an optically flat material fabricated from silicon or various glasses, polymers, and metals.

The differential pressure assembly moves the lower and upper membrane assemblies relative to one another to planarize the coating on the substrate entirely through the application of vacuum and pressure forces. In one embodiment, the differential pressure assembly includes a top pressure chamber positioned above the upper face of the upper sheet, a bottom pressure chamber positioned below the lower face of the lower sheet, a central pressure chamber positioned generally between the lower face of the upper sheet and the upper face of the lower sheet, and conventional vacuum/pressure supplies, valves, sensors, controls, and other equipment for selectively pressurizing and evacuating the top, bottom, and central pressure chambers to sandwich the substrate and its coating between the lower and upper membrane assemblies to achieve contact planarization of the substrate.

The curing or reflowing assembly is provided to cure the planarizing coating on the substrate and may be an infrared lamp (IR), an ultraviolet (UV) lamp, a heater, or any other device capable of curing or reflowing the coating. The curing or reflowing assembly is preferably positioned above the upper membrane assembly and directs light and/or heat to the substrate through the upper sheet. The curing or reflowing assembly can also be located below the lower membrane assembly supplying light and/or heat to the underneath side of the substrate.

In operation, the planarization apparatus is first opened by lifting the curing or reflowing assembly from the lower membrane assembly or otherwise moving the assemblies relative to one another. The lower sheet and substrate stage are then lowered by partially evacuating the bottom pressure chamber. The upper sheet is then placed on the bottom of the upper membrane assembly, and the planarization apparatus is closed. The upper sheet is then secured to the bottom of the curing or reflowing assembly by partially evacuating the top pressure chamber.

The planarization apparatus is then opened so that a substrate may be placed on the substrate stage. After re-closing the apparatus, the vacuum in the top pressure chamber is released to place the upper sheet in its natural, unstressed position.

The differential pressure assembly is then operated to evacuate all three pressure chambers to a desired vacuum level to remove air from the apparatus. At the same time, the differential pressure assembly maintains the pressure differentials between the chambers so that the lower sheet and substrate stage remain in their lowered positions and the upper sheet remains in its unstressed position.

The upper sheet is then deflected downward toward the substrate by reducing the vacuum level in the top pressure chamber. Because the ends of the flexible sheet are held between the curing or reflowing assembly and the lower membrane assembly, the greater vacuum forces in the bottom and central pressure chambers draw the central region of the upper sheet downward toward the center of the substrate.

The vacuum pressure in the bottom pressure chamber is then reduced to raise the lower sheet and substrate stage so that the substrate is sandwiched between the upper sheet and the substrate stage. While maintaining the vacuum level in the central pressure chamber, the differential pressure assembly simultaneously pressurizes both the top and bottom pressure chambers to press the substrate between the lower sheet and substrate stage. During movement of the upper and lower membrane assemblies toward their full planarizing positions, any entrained air bubbles between the upper sheet and the substrate are swept and then evacuated from the apparatus because of the vacuum force in the central pressure chamber.

The curing or reflowing assembly is then operated to cure or reflow the coating on the substrate. After die desired curing or reflowing time has elapsed, the top and bottom pressure chambers are simultaneously depressurized, and the substrate is cooled either actively or passively. The central pressure chamber is then pressurized, and the lower membrane assembly is lowered by pulling a slight vacuum in the bottom pressure chamber. The upper sheet is then deflected downward to separate the upper sheet from the substrate by pressurizing the top pressure chamber.

The top pressure chamber is next evacuated to pull the upper sheet upward so that it is held against the curing or reflowing assembly. The overall assembly is then opened by moving the curing or reflowing assembly relative to the lower membrane assembly so that the substrate may be removed from the substrate stage.

By constructing a contact planarization apparatus as described herein, numerous advantages are realized. For example, by using an upper membrane assembly with an upper flexible sheet, a lower membrane assembly with a lower flexible sheet, and a differential pressure assembly for effecting relative movement of the upper and lower sheets, more precise control of the planarization process can be achieved. The differential pressure assembly also provides more complete evacuation of air from inside the apparatus while simultaneously applying the optimal pressure to the substrate and its coating to more effectively sweep out and eliminate entrapped air bubbles between the substrate and the upper sheet. Additionally, by effecting full planarization of the substrate with two flexible sheets rather than a rigid optical flat and a rigid substrate support assembly, less thermal mass is interposed between the curing or reflowing assembly and the substrate, dramatically reducing the overall curing or reflowing time and increasing the throughput of the apparatus.

These and other important aspects of the present invention are described more fully in the detailed description below.

BRIEF DESCRIPTION OF THE DRAWING FIGURES

A preferred embodiment of the present invention is described in detail below with reference to the attached drawing figures, wherein.

Figure 1:
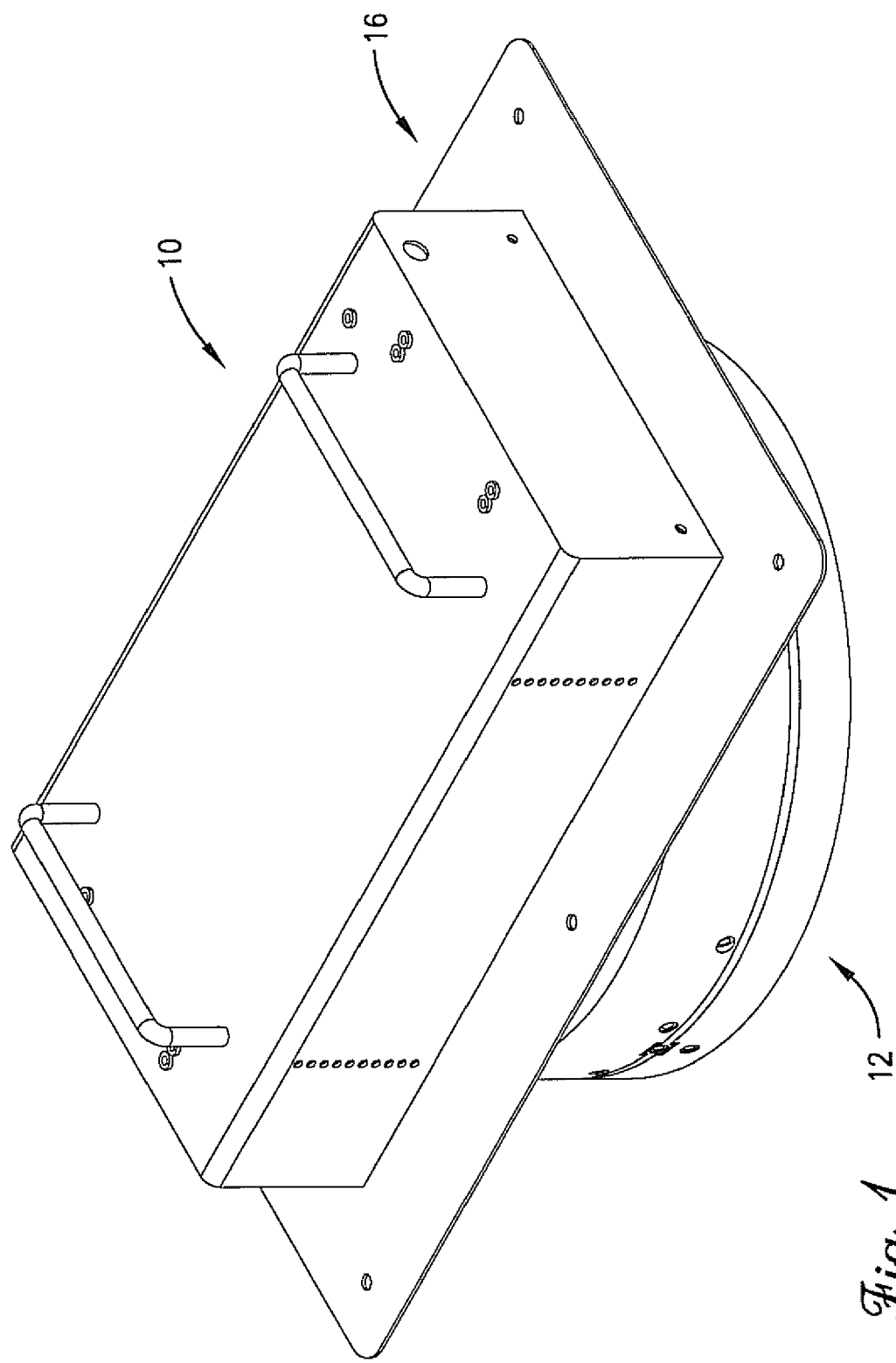
FIG. 1 is a perspective view of a planarization apparatus constructed in accordance with a preferred embodiment of the invention.

The drawing figures do not limit the present invention to the specific embodiments disclosed and described herein. The drawings are not necessarily to scale, emphasis instead being placed upon clearly illustrating the principles of the invention.

DETAILED DESCRIPTION OF THE PREFERRED EMBODIMENTS

The following detailed description of the invention references the accompanying drawings that illustrate specific embodiments in which the invention can be practiced. The embodiments are intended to describe aspects of the invention in sufficient detail to enable those skilled in the art to practice the invention. Other embodiments can be utilized and changes can be made without departing from the scope of the present invention. The following detailed description is, therefore, not to be taken in a limiting sense. The scope of the present invention is defined only by the appended claims, along with the full scope of equivalents to which such claims are entitled.

Turning now to the drawing figures, a planarization apparatus 10 constructed in accordance with a preferred embodiment of the invention is illustrated. The apparatus 10 is designed to efficiently contact planarize coatings applied to individual substrates, such as microelectronic, optoelectronics, photonic, optical, flat panel display, microelectromechanical systems (MEMS), biochips and sensor devices.

Figure 3:
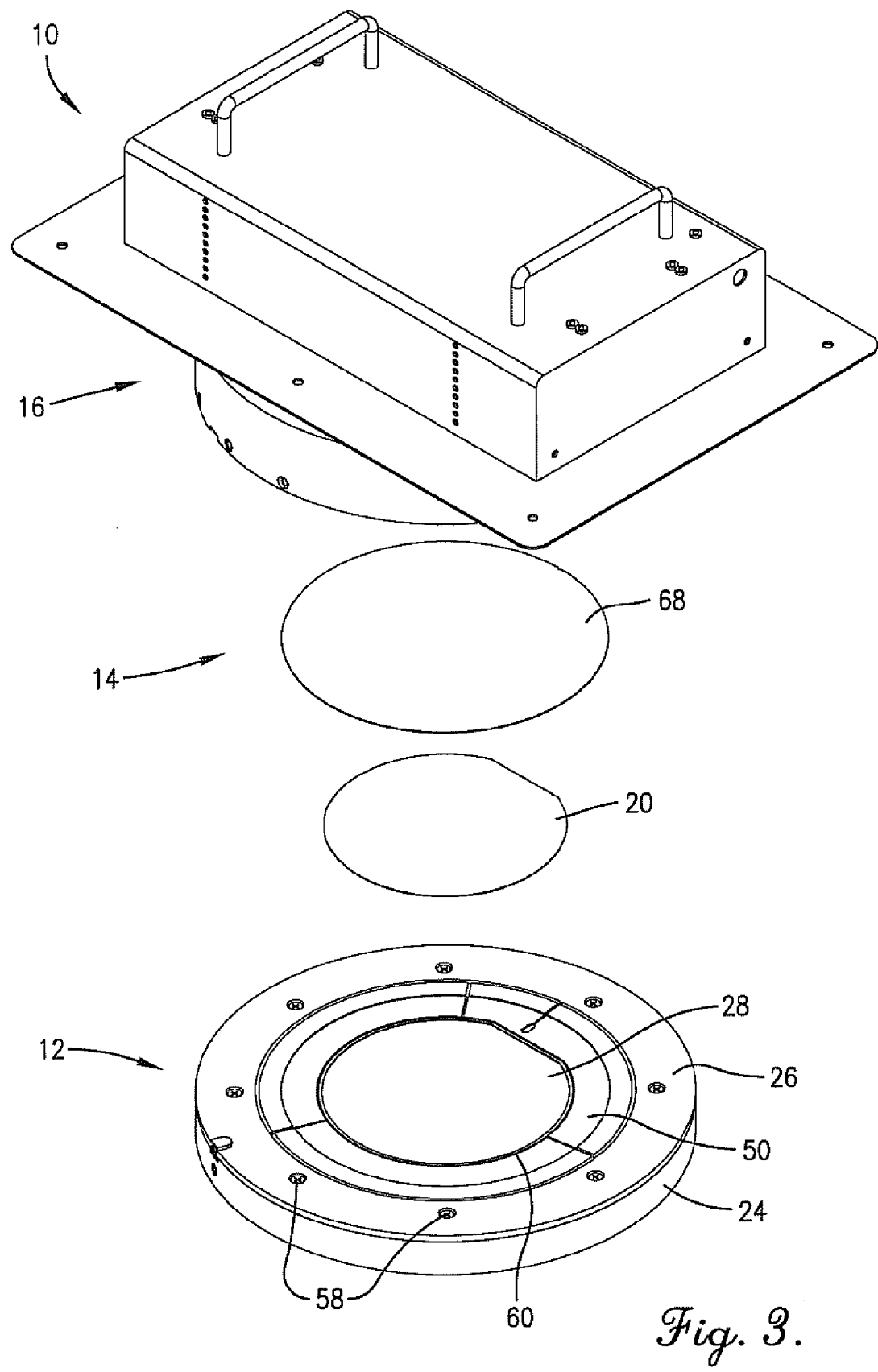
FIG. 3 is a partially exploded view showing the curing or reflowing assembly separated from the lower membrane assembly of the planarization apparatus and showing the upper flexible sheet and substrate positioned therebetween.

As best illustrated in FIG. 3, one embodiment of the planarization apparatus 10 broadly includes a lower membrane assembly 12, an upper membrane assembly 14, a differential pressure assembly (individual components of which are described and numbered below), and a curing or reflowing assembly 16. The apparatus 10 may be supported atop a support frame such as the one disclosed in U.S. Patent Application Publication No. 2005/0056963, hereby incorporated by reference, and may include mechanized equipment for opening and closing the apparatus also as disclosed in the aforementioned patent application.

Figure 2:
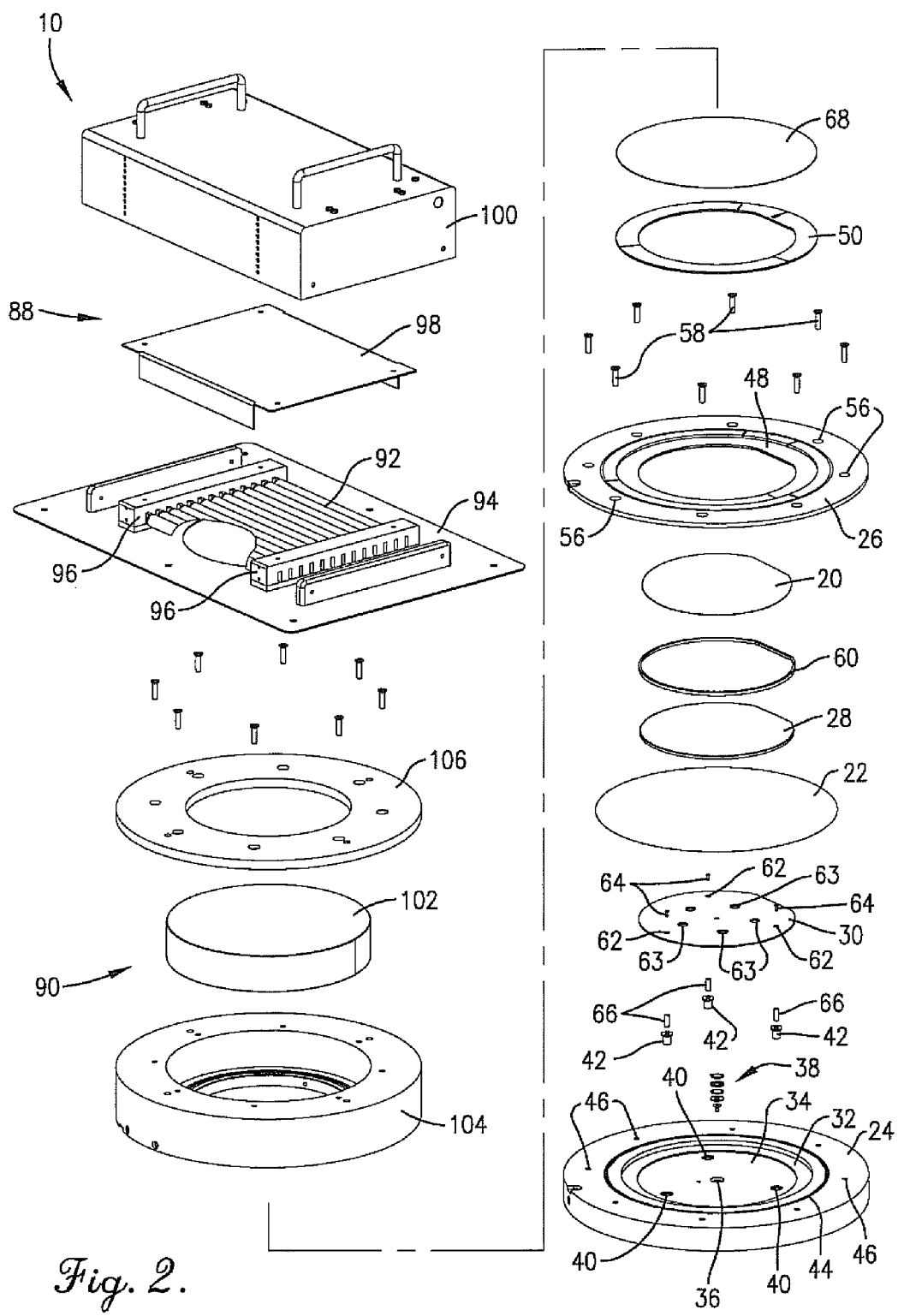
FIG. 2 is an exploded perspective view illustrating the components of the preferred planarizing apparatus.

In more detail, the lower membrane 12 assembly is provided for supporting a substrate 20 to be planarized and for biasing it toward the upper membrane assembly 14 under the influence of the pressure differential assembly. As best illustrated in FIG. 2, the preferred lower membrane assembly includes a flexible lower sheet 22 supported between a pair of clamps 24, 26, a substrate stage 28 positioned atop the flexible sheet for supporting the substrate 20 thereon, and a stabilization stage 30 positioned under the flexible sheet for leveling the substrate stage and for compensating for the weight of the substrate and substrate stage.

The lower sheet 22 is preferably circular in shape and can be formed of materials such as ceramic or highly flexible materials such as a thin layer of material fabricated from polyimide film, fluorocarbons, or other polymers. In accordance with one important aspect of the present invention, the flexible lower sheet 22 (as well as the upper sheet and the substrate stage as discussed below) can be made of materials that vary in bending strength. The strength of the sheet 22 depends on how much circuit topography must be spanned by the apparatus 10. For large span distances, the sheet 22 needs to be stiffer than with smaller span distances. The strength of the sheet 22 must be optimized to control the deflection into the span as well as remain flexible enough to perform the bowing and sweeping actions described herein. By way of example only, the lower sheet 22 may be formed of polyimide film and be approximately 0.003" thick, formed of borofloat glass and be approximately 0.03" thick, be formed of stainless steel and be approximately 0.02" thick, or be formed of aluminum and be 0.03" thick.

Figure 4:
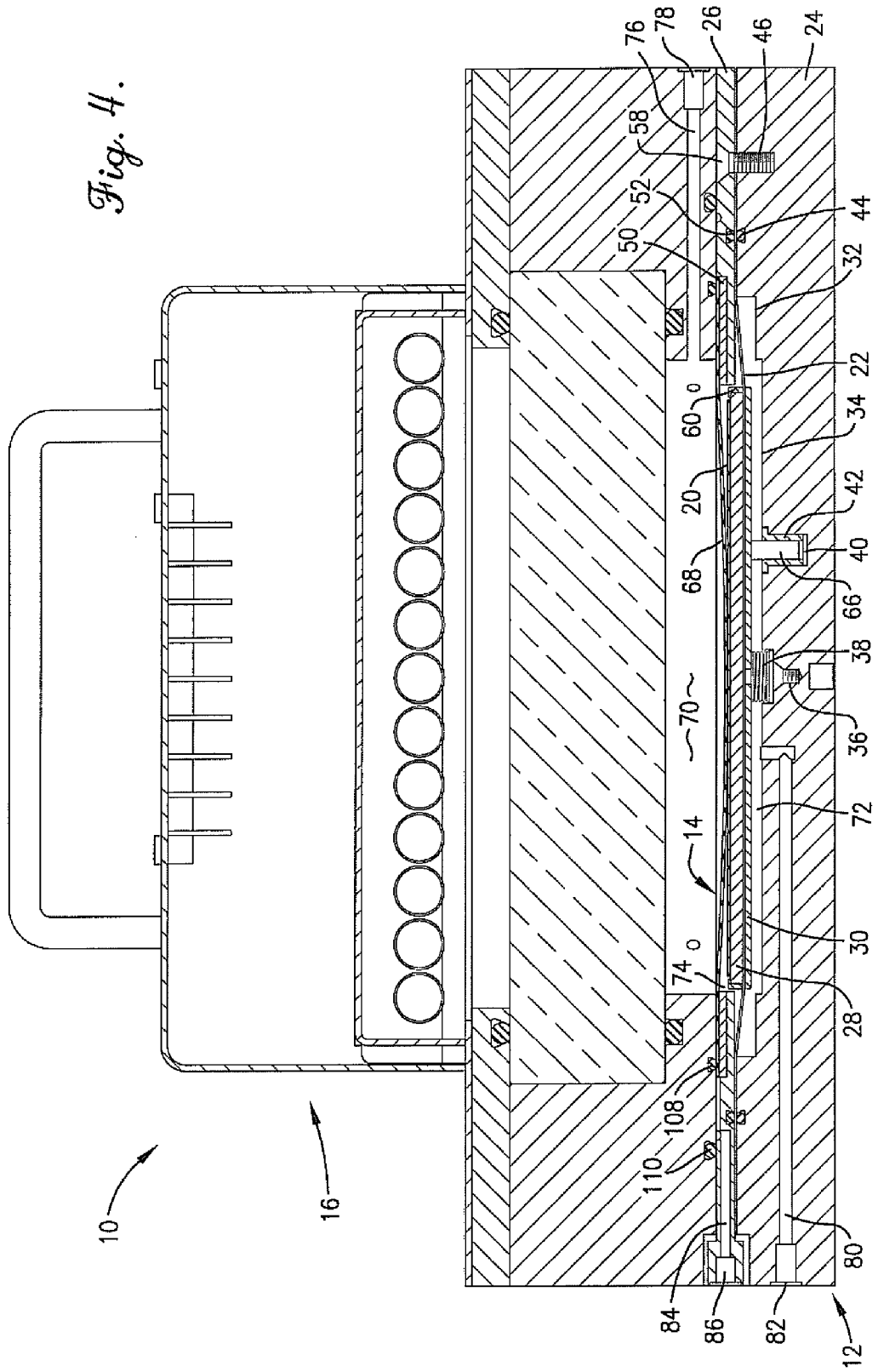
FIG. 4 is a vertical sectional view of the planarization apparatus, showing the lower membrane assembly in its lower position and the upper flexible sheet in its deflected position.

The sheet supporting clamps consist of a circular clamp bottom 24 and a washer-shaped clamp top 26. As best illustrated in FIGS. 2 and 4, the top surface of the clamp bottom 24 includes a pair of steps defining a pair of concentric, recessed regions 32, 34. The centermost recessed region 34 includes a central threaded screw hole or other orifice 36 in which a spring 38 or a plurality of spring-type washers are secured. The recessed region 34 also includes three annularly spaced holes 40 for receiving three bushings 42. The upper margin of the clamp bottom also includes a circular slot for receiving a sealing O-ring 44. A plurality of threaded bolt holes 46 are formed near the periphery of the clamp bottom for use in fastening the clamp bottom and clamp top to one another as described below.

The clamp top 26 is also stepped in cross section to present a recessed region 48 on its top face. A generally ring-shaped thermal barrier 50 is then positioned in the recessed region. As best illustrated in FIG. 4, the bottom face of the clamp top has a circular slot for receiving a sealing O-ring 52 aligned with the O-ring 44 on the clamp bottom. Returning to FIG. 2, a plurality of spaced bolt holes 56 are formed through the clamp top and aligned with the screw holes 46 in the clamp bottom so the clamps may be secured to one another with bolts or other fasteners 58.

The substrate stage 28 is supported atop the lower flexible sheet 22 and is generally circular in shape. The substrate stage maybe formed of a material such as ceramic or a highly flexible material such as a polymer. As with the flexible lower and upper sheets, the substrate stage can be made of materials that vary in bending strength. The strength of the substrate stage depends on how much circuit topography must be spanned by the apparatus. By way of example only, the substrate stage 28 may be formed of mica and be approximately 0.19" thick, be formed of stainless steel and be 0.19" thick, be formed of Teflon® and be approximately 0.02" thick, or be formed of polyimide film and be approximately 0.003" thick. An upstanding circumscribing retaining ring 60 also positioned atop the lower flexible sheet 22 keeps the substrate stage 28 and the substrate 20 centered on the sheet.

The stabilization stage 30 is positioned under the flexible lower sheet 22 and is provided for leveling the substrate stage 28 and for compensating for the weight of the substrate and substrate stage. As shown in FIG. 2, a number of spaced holes 62 extend through the stabilization stage to receive screws or other fasteners 64 for attaching support pins 66 to the underside of the stabilization stage. The support pins are received in and move up and down relative to the bushings 42 as the stabilization stage moves up and down relative to the clamps. A number of larger holes 63 through the stabilization stage permit air or gas pressurized in the bottom pressure chamber to contact the lower face of the lower sheet 22.

The upper membrane assembly 14 is provided for planarizing the coating on the substrate 20 tinder the influence of the differential pressure assembly and includes a flexible upper sheet 68 supported above the substrate stage 28 and below the curing or reflowing assembly 16 via a vacuum force applied by the differential pressure assembly. The flexible upper sheet is preferably formed from an optically flat material fabricated from silicon or various glasses, polymers, and metals. As with the lower sheet 22, the flexible upper sheet 68 can be made of materials that vary in bending strength. The strength of the sheet 68 depends on how much circuit topography must be spanned by the apparatus. For large span distances, the sheet needs to be stiffer than with smaller span distances. The strength of the sheet must be optimized to control the deflection into the span as well as remain flexible enough to perform the bowing and sweeping actions described herein. The materials forming the sheet 68 may also be selected to accommodate non-uniformity in the thickness of the substrate 20. If the substrate that is being planarized has a lot of thickness variation, the upper sheet needs to be conformal so that it makes contact with all of the surface. By way of example only, the upper sheet may be formed of polyimide film and be approximately 0.003" thick, be formed of borofloat glass and be approximately 0.03" thick, be formed of stainless steel and be approximately 0.02" thick, be formed of aluminum and be 0.03" thick, or be formed of silicon and be approximately 0.03" thick.

Figure 5:
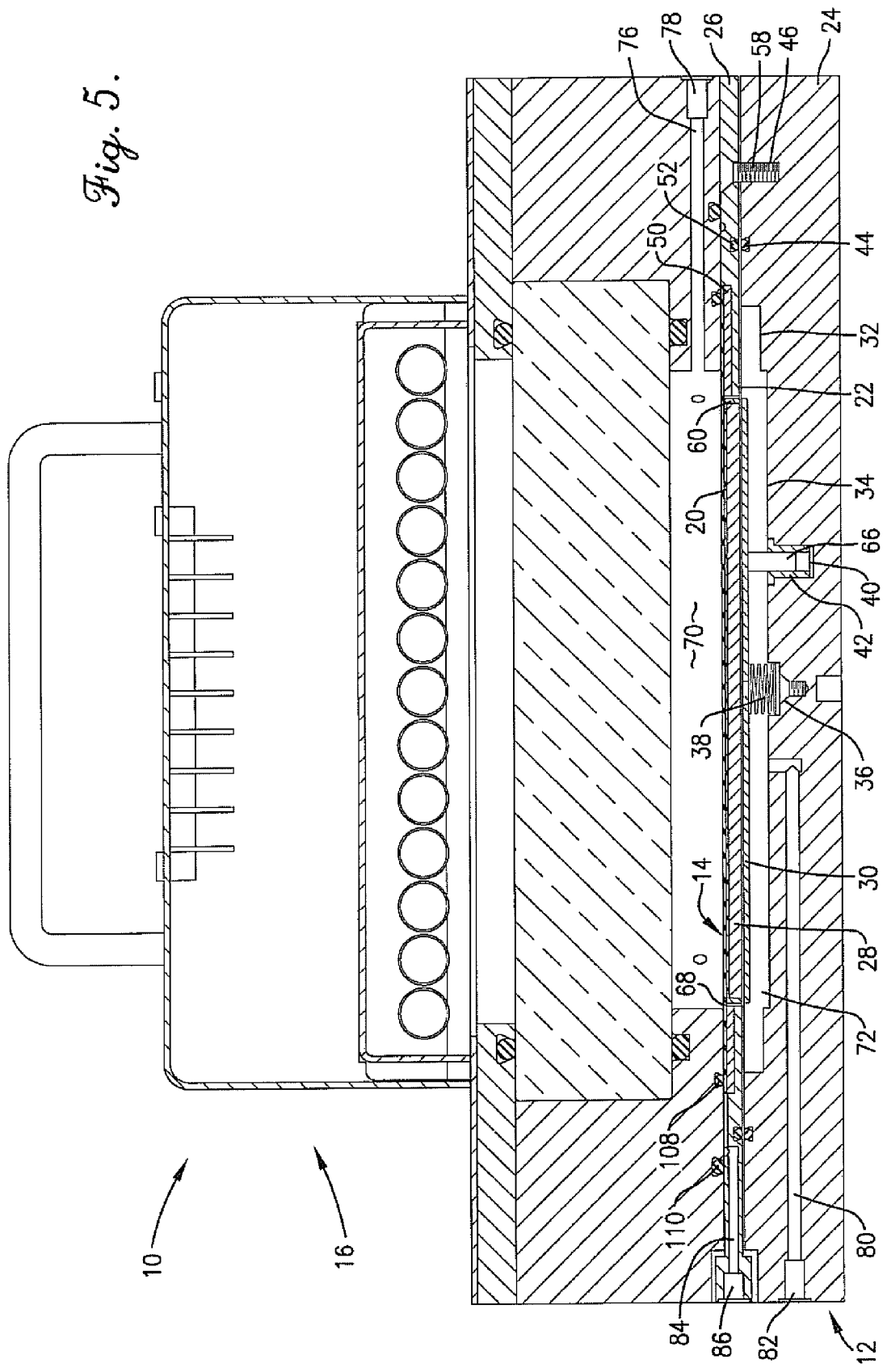
FIG. 5 is a vertical sectional view of the planarization apparatus, showing the lower membrane assembly and the upper flexible sheet in their full planarization positions.

As best illustrated in FIGS. 4 and 5, the differential pressure assembly broadly includes a top pressure chamber 70, a bottom pressure chamber 72, and a central pressure chamber 74. In accordance with an important aspect of the present invention, the differential pressure assembly moves the lower and upper membrane assemblies relative to one another to planarize the coating on the substrate 20 entirely through the application of vacuum and pressure forces.

The top pressure chamber 70 is positioned above the upper sheet 68 and is defined by the inner walls of the lens assembly and the upper face of the upper sheet. A pneumatic passageway 76 formed through the curing or reflowing assembly connects the top pressure chamber 70 to an externally accessible pneumatic fitting or port 78.

The bottom pressure chamber 72 is positioned below the lower sheet 22 and is defined by the recessed regions 32, 34 of the clamp bottom and the lower face of the lower sheet 22. A pneumatic passageway 80 formed through the clamp bottom connects the bottom pressure chamber 72 to an externally accessible pneumatic fitting or port 82.

Figure 7:
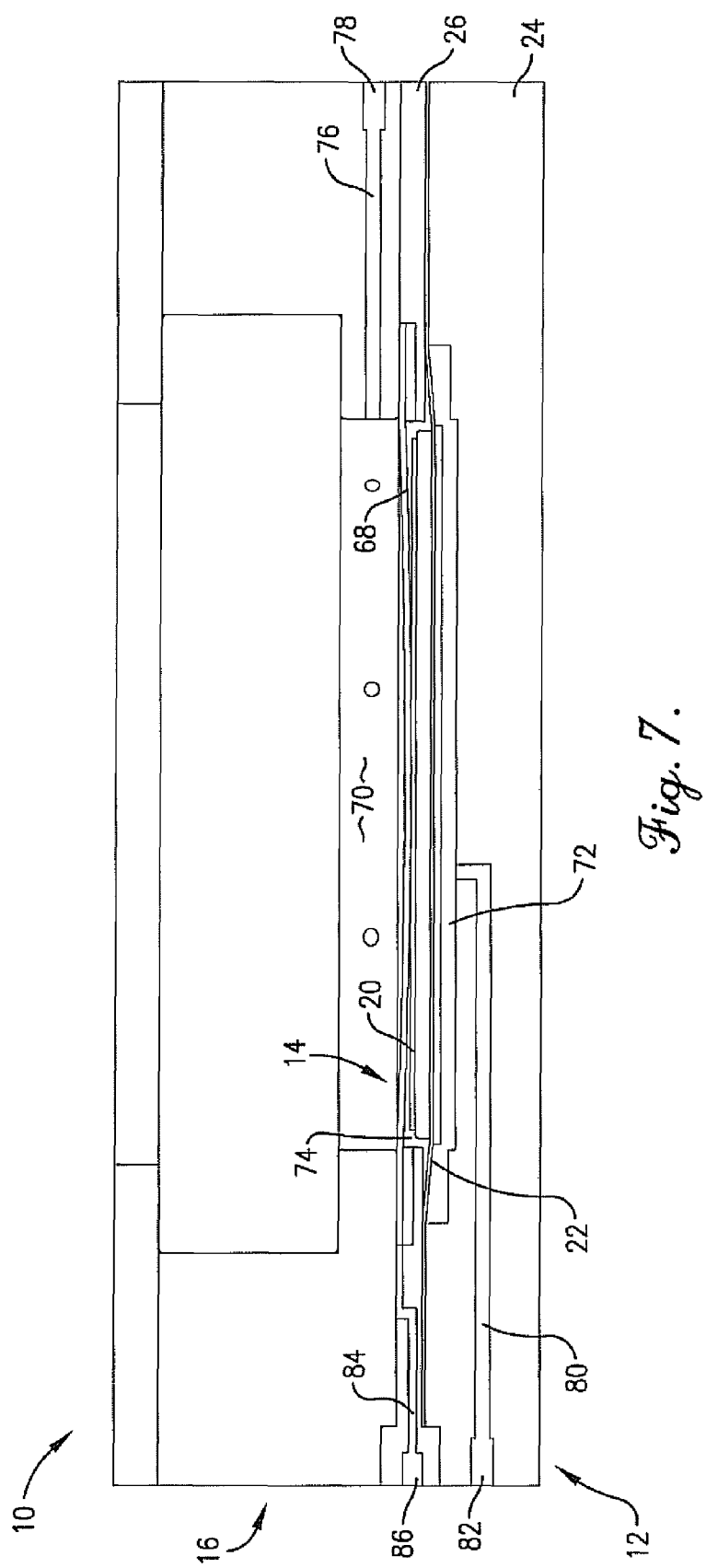
FIG. 7 is another schematic illustration depicting the planarization apparatus in its closed position with the upper and lower membrane assemblies in a partial planarization position.
Figure 8:
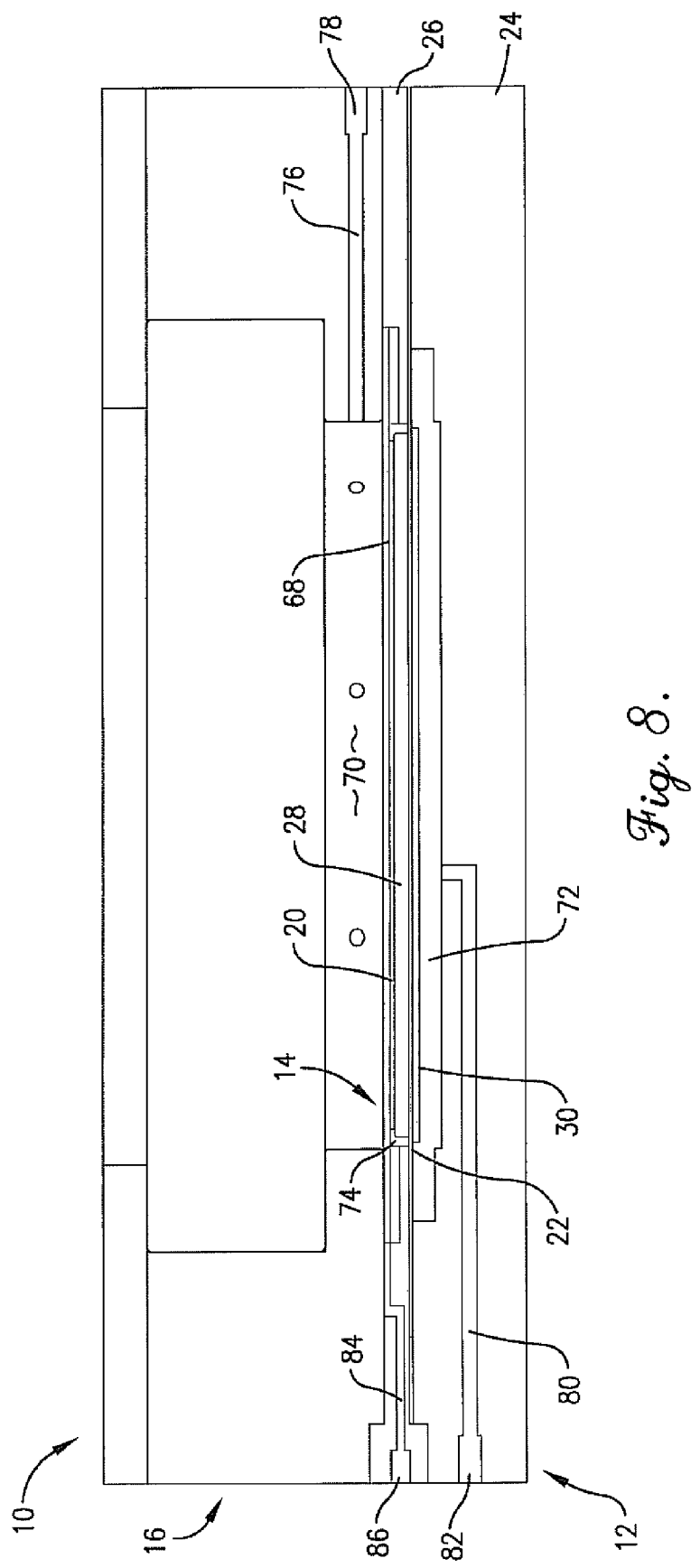
FIG. 8 is another schematic illustration depicting the planarization apparatus in its closed position with the upper and lower membrane assemblies in their full planarization positions.

The central, or middle, pressure chamber 74 best depicted in FIGS. 4 and 7 is positioned between and defined by the lower face of the upper sheet 68 and the upper face of the lower sheet 22. The central pressure chamber is in fluid communication with a pneumatic passageway 84 which terminates at an externally accessible pneumatic fitting or port 86. The differential pressure assembly also includes conventional vacuum/pressure supplies, valves, sensors, controls, and other equipment for selectively pressurizing and evacuating the top, bottom, and central pressure chambers to sandwich the substrate and its coating between the lower and upper membrane assemblies to achieve contact planarization of the substrate as described in more detail below.

The curing or reflowing assembly 16 is provided to cure or reflow the planarizing coating on the substrate 20 and may be an infrared lamp (IR), an ultraviolet (UV) lamp, a heater, or any other device capable of curing or reflowing the coating. The curing or reflowing assembly is preferably positioned above the upper membrane assembly and diverts light and/or heat to the substrate through the upper sheet 68. As best illustrated in FIG. 2, an embodiment of the curing or reflowing assembly 16 includes a lamp assembly 88 and an optional lens assembly 90.

The lamp assembly 88 includes a plurality of infrared or ultraviolet bulbs 92 mounted to a support plate 94 along with an associated mounting assembly 96. A reflector 98 is mounted above the bulbs to reflect light downward toward the substrate 20, and an upper shroud 100 with handles covers the bulbs, transformer, and reflector.

The lens assembly 90 includes a clear lens 102 fabricated of quartz or other suitable material and supported between a ring-shaped housing 104 and washer-shaped retainer 106. The lens assembly 90 is preferably screwed, bolted, or fastened to the underside of the lamp assembly 88 by a plurality of conventional fasteners. The lower face of the lens housing 104 includes a pair of circular slots for receiving a pair of sealing O-rings 108, 110 as best illustrated in FIGS. 4 and 5.

Operation

In operation, the planarization apparatus 10 is first opened by lifting the curing or reflowing assembly 16 from the lower membrane assembly 12 or otherwise moving the assemblies relative to one another. The lower sheet 22 and substrate stage 28 are then lowered by partially evacuating the bottom pressure chamber 72 with the differential pressure assembly by drawing a vacuum of between 500 and 750 torr through the port 82. This causes the stabilization stage 30 to slightly compress the spring 38 and bias the support pins 66 on the underside of the stabilization stage into their corresponding bushings 42 as best illustrated in FIG. 4. The upper sheet 68 is then placed on top of the thermal barrier 50 and the curing or reflowing assembly 16 is placed or otherwise moved back on top of the lower membrane assembly 12 to close the apparatus. The top pressure chamber 70 is then partially evacuated by drawing a vacuum of between 500 and 750 torr through the port 78 to secure the upper sheet 68 to the bottom of the curing or reflowing assembly.

Figure 6:
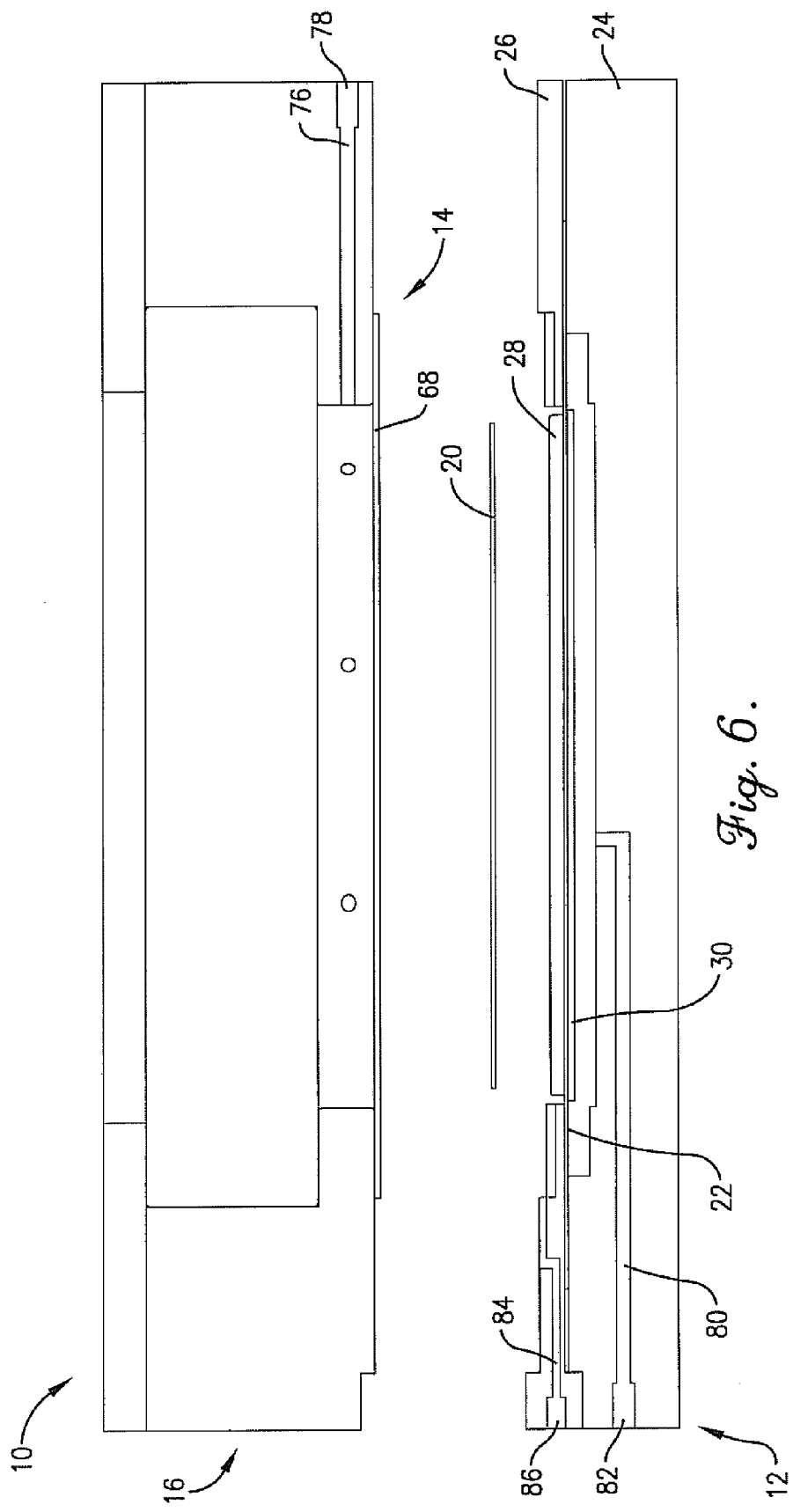
FIG. 6 is a schematic illustration depicting the planarization apparatus in its open position with a substrate positioned between the lower membrane assembly and the curing or reflowing assembly.

The apparatus is then opened as depicted in the schematic illustration of FIG. 6 so that a substrate 20 to be planarized may be placed on the substrate stage 28. When the apparatus is re-closed, the differential pressure assembly is operated to release the vacuum in the top pressure chamber 70 to place the upper sheet 68 in its natural, unstressed position.

The differential pressure assembly is next operated to evacuate all three pressure chambers to a desired vacuum level to remove air from inside the apparatus. Generally a vacuum from about 25 to 250 torr is desired in all three chambers. At the same time, the differential pressure assembly maintains the pressure differentials between the chambers so that the lower sheet 22 and substrate stage 28 remain in their lowered positions and the upper sheet 68 remains in its unstressed position. Thus, the bottom pressure chamber 72 may be subjected to a vacuum of about 25 to 250 torr greater than the other two chambers at this point in the planarization process.

The upper sheet 68 is then deflected downward toward the substrate 20 by reducing the vacuum level in the top pressure chamber 70 by about 25 to 250 torr. Because the ends of the upper sheet are held between the curing or reflowing assembly and the lower membrane assembly, the greater vacuum forces in the bottom and central pressure chambers draw the central region of the upper sheet downward toward the center of the substrate. At this point, the components of the apparatus are in the positions illustrated in FIGS. 4 and 7. U.S. Patent Application Publication No. 2005/0056963 referenced above describes the advantages of first planarizing the center of the substrate in more detail.

The vacuum pressure in the bottom pressure chamber 72 is then reduced to match vacuum pressure in the top pressure chamber to raise the lower sheet 22, substrate stage 28, and stabilization stage 30 so that the entire surface area of the substrate becomes fully sandwiched between the upper sheet 68 and the substrate stage. At this point, the components of the apparatus are in the positions illustrated in FIG. 5. While maintaining the vacuum level in the central pressure chamber 74, the differential pressure assembly simultaneously pressurizes both the top and bottom pressure chambers 70, 72 to about 5 to 200 psi or 250 to 10,500 torr to firmly press the substrate between the upper sheet and the substrate stage to planarize the coating on the substrate and to sweep out any entrained air between the upper sheet and the substrate. During movement of the upper and lower membrane assemblies toward their full planarizing positions, air bubbles which are swept out of the substrate are removed and evacuated from the apparatus through the port 86 because of the vacuum force in the central pressure chamber.

The curing or reflowing assembly 16 is then operated to cure or reflow the coating on the substrate. After the desired curing or reflowing time has elapsed, the top and bottom pressure chambers 70, 72 are simultaneously depressurized. The substrate 20 may then be cooled either actively or passively before or after the top and bottom pressure chambers 70, 72 are depressurized. The central pressure chamber 74 is then pressurized, and the lower membrane assembly is lowered by pulling a slight vacuum in the bottom pressure chamber 72. The upper sheet 68 is then deflected downward by pressurizing the top pressure chamber 70 to separate the upper sheet from the substrate.

The top pressure chamber 70 is then evacuated to pull the upper sheet 68 upward and to hold it against the curing or reflowing assembly. The overall assembly is then opened by moving the curing or reflowing assembly relative to the lower membrane assembly so that the substrate maybe removed from the substrate stage and another substrate may be inserted for planarization.

The planarization apparatus of the present invention more effectively and efficiently planarizes ICs and other substrates. For example, because the apparatus uses a differential pressure assembly to move flexible lower and upper planarizing sheets to planarize a substrate rather than pressing the substrate between one or more rigid surfaces or backings, more precise control of the planarization process can be achieved. The differential pressure assembly also provides more complete evacuation of air from inside the apparatus while simultaneously applying the optimal pressure to the substrate and its coating to more effectively sweep out and eliminate entrapped air bubbles between the substrate and the upper sheet. Additionally, by effecting full planarization of the substrate with two flexible sheets rather than a rigid optical flat and a rigid substrate support assembly, less thermal mass is interposed between the curing or reflowing assembly and the substrate, dramatically reducing the overall curing or reflowing time and increasing the throughput of the apparatus.

Although the invention has been described with reference to the preferred embodiment illustrated in the attached drawing figures, it is noted that equivalents may be employed and substitutions made herein without departing from the scope of the invention as recited in the claims. For example, the particular order of the steps in the Operation section above may be revised or otherwise changed and some of the steps can even be performed simultaneously without departing from the scope of the invention. Additionally, the particular materials, dimensions, vacuum levels, and pressure levels disclosed herein may be altered.

Having thus described the preferred embodiment of the invention, what is claimed as new and desired to be protected by Letters Patent includes the following:

1. A planarization apparatus for planarizing a curable or reflowable coating applied to a substrate, the apparatus comprising:
    a lower membrane assembly for supporting the substrate thereon, the lower membrane assembly including a lower flexible sheet;
    an upper membrane assembly including an upper flexible sheet; and
    a differential pressure assembly operable to create a pressure differential which deflects the upper flexible sheet downward and deflects the lower flexible sheet upward to press an upper surface of the substrate against a lower face of the upper flexible sheet to planarize the coating on the substrate, the differential pressure assembly including an upper pressure chamber positioned above an upper face of the upper flexible sheet, a lower pressure chamber positioned below a lower face of the lower flexible sheet, a central pressure chamber positioned generally between the lower face of the upper flexible sheet and the upper face of the lower flexible sheet, and apparatus for selectively pressurizing, and evacuating the upper, lower, and central pressure chambers.

2. The apparatus as set forth in claim 1, the lower membrane assembly further including a substrate stage positioned atop the lower flexible sheet for supporting the substrate thereon and a stabilization stage positioned under the lower flexible sheet for leveling the substrate stage and for compensating for the weights of the substrate and substrate stage.

3. The apparatus as set forth in claim 1, further including a curing or reflowing assembly for curing or reflowing the coating on the substrate.

4. The apparatus as set forth in claim 3, wherein the curing or reflowing assembly is selected from the group consisting of an IR lamp assembly, a UV lamp assembly, a heated and/or cooled fluid assembly, and a heater.

5. The apparatus as set forth in claim 1, further including a thermal barrier positioned between the lower and upper membrane assemblies.

6. The apparatus as set forth in claim 2, the lower membrane assembly further including a retainer ring for retaining the substrate stage on the flexible sheet.

7. The apparatus as set forth in claim 2, the stabilization stage including a support plate, a plurality of support posts depending from a bottom face of the support plate and moveable within corresponding bushings, and a spring positioned below the bottom face of the support plate for biasing the support plate upward.

8. The apparatus as set forth in claim 3, further including a mechanism for effecting relative movement between the lower membrane assembly and the curing or reflowing assembly to permit placement of the substrate therebetween.

9. The apparatus as set forth in claims 1, wherein a strength of the lower flexible sheet and a strength of the upper flexible sheet are selected based on a topography of the substrate.

10. The apparatus as set forth in claim 9, wherein the strength of both the lower flexible sheet and the upper flexible sheet are increased for span distances between circuit elements on the substrate.

11. A planarization apparatus for planarizing a curable or reflowable coating applied to a substrate, the apparatus comprising:
    a lower membrane assembly for supporting the substrate thereon, the lower membrane assembly including a lower flexible sheet; and
    a differential pressure assembly operable to create a pressure differential between upper and lower faces of the lower flexible sheet to deflect the sheet upward to press an upper surface of the substrate against an upper planarizing surface, the differential pressure assembly including an upper pressure chamber positioned above an upper face of the upper flexible sheet, a lower pressure chamber positioned below a lower face of the lower flexible sheet, a central pressure chamber positioned generally between the lower face of the upper flexible sheet and the upper face of the lower flexible sheet, and apparatus for selectively pressurizing and evacuating the upper, lower, and central pressure chambers.

12. The apparatus as set forth in 11, wherein the upper planarizing surface is an upper membrane assembly including a flexible sheet positioned above the lower membrane assembly.

13. The apparatus as set forth in claim 12, wherein the differential pressure assembly is operable to create a pressure differential between upper and lower faces of the upper flexible sheet to deflect the sheet downward to press a lower face of the sheet against the substrate.

14. The apparatus as set forth in claim 11, the lower membrane assembly further including a substrate stage positioned atop the lower flexible sheet for supporting the substrate thereon and a stabilization stage positioned under the lower flexible sheet for leveling the substrate stage and for compensating for the weights of the substrate and substrate stage.

15. The apparatus as set forth in claim 11, further including a curing or reflowing assembly for curing or reflowing the coating on the substrate.

16. The apparatus as set forth in claim 15, wherein the curing or reflowing assembly is selected from the group consisting of an IR lamp assembly, a UV lamp assembly, and a heater.

17. The apparatus as set forth in claim 11, further including a thermal barrier positioned on the lower membrane assembly.

18. The apparatus as set forth in claim 14, the lower membrane assembly further including a retainer ring for retaining the substrate stage on the lower flexible sheet.

19. The apparatus as set forth in claim 14, the stabilization stage including a support plate, a plurality of support posts depending from a bottom face of the support plate and moveable within corresponding bushings, and a spring positioned below the bottom face of the support plate for biasing the support plate upward.

20. The apparatus as set forth in claim 15, further including a mechanism for effecting relative movement between the lower membrane assembly and the curing or reflowing assembly to permit placement of the substrate therebetween.

21. The apparatus as set forth in claims 11, wherein a strength of the lower flexible sheet and a strength of the upper flexible sheet are selected based on a topography of the substrate.

22. The apparatus as set forth in claim 21, wherein the strength of both the lower flexible sheet and the upper flexible sheet are increased for larger span distances between circuit elements on the substrate.

* * * * *